United States Patent [19]

Ohkubo et al.

[11] Patent Number: 5,157,691
[45] Date of Patent: Oct. 20, 1992

[54] DIGITAL EQUALIZER AND FM RECEIVER HAVING SAME

[75] Inventors: Hideki Ohkubo; Kaname Abe; Shinya Fukuoka, all of Kawagoe, Japan

[73] Assignee: Pioneer Electronic Corporation, Tokyo, Japan

[21] Appl. No.: 498,672

[22] Filed: Mar. 26, 1990

[30] Foreign Application Priority Data

Jul. 31, 1989 [JP] Japan .................. 1-198151

[51] Int. Cl.$^5$ ............................................. H04L 27/01
[52] U.S. Cl. ........................................ 375/14; 333/18; 375/98
[58] Field of Search ............... 375/12, 11, 14, 98, 375/96; 364/724.2, 724.01, 724.16; 381/2, 3, 13, 103; 455/65, 234, 249, 296, 311; 333/28, 18

[56] References Cited

U.S. PATENT DOCUMENTS

| | | | |
|---|---|---|---|
| 4,071,827 | 1/1978 | Koike et al. | 375/12 |
| 4,456,893 | 6/1984 | Otani | 375/12 X |
| 4,604,755 | 8/1986 | Murray | 375/98 |
| 4,799,025 | 1/1989 | Queau | 375/96 |
| 4,839,905 | 6/1989 | Mantovani | 375/12 |
| 5,003,555 | 3/1991 | Bergmans | 375/12 |

FOREIGN PATENT DOCUMENTS 62-140527  6/1987  Japan .

OTHER PUBLICATIONS

"A New Approach to Multipath Correction of Constant Modulus Signals" IEEE Transactions on Acoustics, Speech and Signal Processing, vol. ASSP-31, No. 2, Apr. 1983.

"Multipath Cancelling of Constant Envelope Signal Using Decision Feedback", by Makoto Itami and Mitsutoshi Hatori, of the University of Tokyo, Engineering Faculty; 1987.

"A Modified Adaptive FIR Equalizer For Multipath Echo Cancellation in FM Transmission", IEEE Journal on Selected Areas in Communications, vol. SAC-5, No. 2, Feb. 1987.

*Primary Examiner*—Benedict V. Safourek
*Attorney, Agent, or Firm*—Sughrue, Mion, Zinn, Macpeak & Seas

[57] ABSTRACT

A digital equalizer has a digital filter. The digital filter is supplied with a digital input signal which corresponds to a multiplex signal composed of a plurality of signal components that are different in amplitude or phase and have the same frequency, and effects a computational digital filtering process on the supplied digital input signal. The digital filter is connected to a feedback circuit. The feedback circuit compares an output signal from the digital filter with a predetermined reference value signal. The feedback circuit has a multiplier which multiplies the output signal from the digital filter by a coefficient signal corresponding to an error of the output signal with respect to the predetermined reference value signal. Based on an output signal from the multiplier, the feedback circuit controls the amplitude of the output signal from the digital filter so as to be constant.

13 Claims, 5 Drawing Sheets

DIGITAL EQUALIZER AND FM RECEIVER HAVING SAME

BACKGROUND OF THE INVENTION

The present invention relates to a digital equalizer and a FM receiver having the digital equalizer, and more particularly to a multipath correcting filter which corrects a multipath signal component present in a signal which is received by an FM receiver, for example.

One problem which is frequently encountered in the reception of FM broadcasts is multipath transmission. The multipath transmission is a phenomenon where a single radio wave or a plurality of radio waves which are reflected and delayed by a mountain or mountains, a building or buildings, or other objects, reach the receiver via two or more paths together with a radio wave directly from the transmitter. After such multiple signals are frequency-modulated, they result in distortion in the receiver and lower the quality of the broadcast which is received. The problem of multipath transmission manifests itself particularly with mobile receivers such as car radio receivers.

In order to solve the multipath transmission problem, it is necessary to obtain the proper radio signal from the signals which have reached the receiver by multipath reception. One scheme is to use an adaptive filter which carries out adaptive signal processing, the adaptive filter being used as a multipath correcting filter. According to the adaptive signal processing effected by the adaptive filter, the mean square of an error or difference between a desired response for the filter and an actual output of the filter, i.e., the mean square error is defined as an evaluating function, and the coefficient of the filter is controlled such that the evaluating function will be minimized.

There is known an application in which an adaptive filter is used as a multipath correcting filter. The multipath correcting filter employs the envelope (amplitude) of an FM signal transmitted from a broadcasting station, as a desired response for the filter, and any error between the desired response and the output of the filter is processed according to the adaptive signal process. Multipath correcting filters which are based on the above concept are disclosed in the following documents:

1. "A New Approach to Multipath Correction of Constant Modulus Signals" written by J. R. Treichler and B. C. Agee, IEEE trans. Vol. ASSP-31, No. 2, pp. 459–471 (1983); and 2. "Multipath Removal from Constant-Envelope Signals With Decision Feedback System" written by Itami and Hadori, Shingakugiho, CAS877-154, pp. 19–24 (1987).

Sufficient multipath correction of FM broadcast signals using the above known multipath correcting filters, however, requires a considerable number of filter coefficients, and, as a result, the amount of the computational filtering process and the computational process for filter coefficient control is enormous.

Another conventional multipath correcting filter normalizes the transfer function of a multiple transmission path with reference to a radio wave transmitted directly from the transmitter (hereinafter referred to as a "direct radio wave", for the computational filtering process. The following documents show this type of multipath correcting filter:

3. "Modified Adaptive FIR Equalizer for Multipath Echo Cancellation in FM Transmission" written by K. D. Kammeyer, R. mann, and W. Tobergte, IEEE J vol. SAC-5, no. 2, pp. 226–237 (1987); and 4. Japanese Laid-Open Patent Publication No. 62(1987)-140527.

Also known is a multipath correcting filter in which the digital filter in the above conventional design comprises a cascaded FIR finite impulse response filter) also known as a "transversal filter").

In actual radio signals, the amplitude of a direct radio wave is unknown, and it is impossible to normalize radio signals applied to the multipath correcting filter. Therefore, it is difficult to determine a reference value. With mobile receivers such as car radio receivers, the intensity of a received direct radio wave varies from place to place, and hence the received multipath signals cannot be normalized according to the amplitude of the direct radio wave. In this case, the amplitude of the direct radio wave itself is used as a reference value, rather than any normalized signal. Accordingly, it is highly difficult to obtain an output signal having a constant amplitude.

SUMMARY OF THE INVENTION

It is an object of the present invention to provide a digital equalizer and a FM receiver having the digital equalizer which is capable of multipath correction without filter input signals being normalized according to the amplitude of a direct radio wave.

To accomplish the above object, a digital equalizer comprises a digital filter for effecting a computational digital filtering process on a digital input signal which corresponds to a multiplex signal composed of a plurality of signals that are different in amplitude or phase and have the same frequency, and a feedback circuit for comparing an output signal from the digital filter with a predetermined reference value signal and controlling the amplitude of the output signal so as to be constant based on an error of the output signal from the reference value signal, the feedback circuit including a multiplier for multiplying the output signal by a coefficient signal corresponding to the error.

Further, according to this invention, there is provided an FM receiver comprising: a reception circuit for detecting a signal having a desired frequency from signals received by an antenna and producing a detected output signal; an A/D converter for converting the detected output signal into a digital signal; a digital equalizer for correcting a multipath signal contained in the digital signal and producing a desired received signal; and a demodulator for demodulating said received signal; said digital equalizer comprising, a digital filter for effecting a computational digital filtering process on a digital input signal which corresponds to a multiplex signal composed of a plurality of signals that are different in amplitude or phase and have the same frequency, and a feedback circuit for comparing an output signal from said digital filter with a predetermined reference value signal and controlling the amplitude of said output signal so as to be constant based on an error of the output signal from said reference value signal, said feedback circuit including a mutiplier for multiplying said output signal by a coefficient signal corresponding to said error.

With the above arrangement, the output signal from the digital filter is fed back by the feedback circuit, and the error thereof with respect to the reference value signal is determined. The output signal thus fed back is multiplied by the coefficient signal corresponding to the error. The coefficient signal is repeatedly renewed at the same time when the filter coefficient of the digital filter is renewed. As a result, the error is converged to zero, and the amplitude is rendered constant. The amplitude of the output signal from the digital filter therefore becomes constant. Consequently, the output signal is free from cross modulation distortion which would otherwise be caused by the multiplex signal. According to the present invention, any desired input signal can appropriately be equalized without normalization of the signal according to the amplitude of a direct radio wave, so that proper signal data can be obtained. In particular, a radio signal which is received by way of multipath transmission can be equalized i.e., multipath correction). The digital equalizer is effective in improving the quality of broadcasts received by car radio receivers which tend to have varying received signal intensities.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Technical Background

Figure 1:
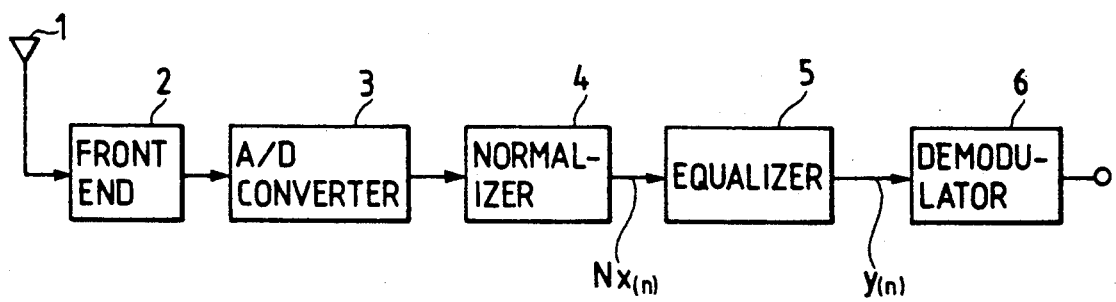
FIG. 1 is a block diagram of an FM tuner including a conventional equalizer.

Prior to a detailed description of the present invention, a certain technical background will be described below for a fuller understanding of the invention.

First, an adaptive filter will be described below.

An output $y_{(n)}$ at a time n of a discrete filter is given as follows:

$$y(n) = \sum_{k=0} a_k \cdot Nx_{(n-k)} \quad (1)$$

where $a_k$ is the coefficient of the filter and $Nx_{(n-k)}$ is an input signal applied to the filter.

According to adaptive signal processing, the mean square value $\epsilon$ of an error (deviation or difference between a desired response $d_{(n)}$ for the filter and he filter output $y_{(n)}$, $$e_{(n)} = d_{(n)} - y_{(n)} \quad (2)$$

i.e., the mean square error $\epsilon$ is defined as an evaluating function F, $$\epsilon = E[e_{(n)}2] = F \quad (3)$$

where $E[\cdot]$ is a calculated expected value, and the coefficient of the filter is controlled (adjusted) such that the evaluating function will be minimized.

For the control of the coefficient of the adaptive filter, there has widely been employed a sequential correction gradient algorithm which needs a relatively few calculations and is capable of easy real-time processing. According to this algorithm, a corrective amount vector $\Delta \bar{a}_{(n)}$ of a coefficient vector $\bar{a}_{(n)}$ which is estimated at the time n is determined, and $$\bar{a}_{(n+1)} = \bar{a}_{(n)} - \Delta \bar{a}_{(n)} \quad (4)$$

is regarded as a coefficient vector at a time (n+1) and sequentially converged into an optimum coefficient vector. The corrective amount vector $\Delta \bar{a}_{(n)}$ is determined by the steepest gradient of the evaluating function F, i.e., $$\bar{a}_{(n+1)} = \bar{a}_{(n)} - \alpha \cdot \frac{\partial F}{\partial \bar{a}_{(n)}} \quad (5)$$

becomes the coefficient vector at the time (n+1). In the equation (5), $\alpha$ is a positive constant for controlling the corrective amount. The coefficient vector $\bar{a}_{(n)}$ is given by:

$$\bar{a}(n) = [\ldots, a_{k(n)}, \ldots]^T \quad (6)$$

where T expresses transposition.

One the known multipath correcting filters which employ such an adaptive filter is described below.

An FM signal is of constant amplitude as no information is contained in the amplitude (envelope) of the FM signal. The envelope of an FM signal which is sent by ay of multipath transmission fluctuates under the influence of its transfer function. Therefore, it may be possible to regard a signal having a constant envelope as desired response and to apply the concept of an adaptive filter to a multipath transmission correcting filter. An evaluating function for the adaptive control of a filter coefficient may be given, for example, by:

$$F = E(\{|y_{(n)}|^2 - g_{(n)}\}^2) \quad (7)$$

where $g_{(n)}$ is a reference value which is constant, or $$F = E\left[\left(y(n) - \frac{g(n)}{|y(n)|}\right)^2\right] \quad (8)$$

where $g_{(n)}$ is a reference value which is constant.

Sufficient multipath correction of FM broadcast signals using the above evaluating functions, however, requires a considerable number of filter coefficients, and, as a result, the amount of the computational filtering processing and the computational processing for filter coefficient control is enormous, as described previously.

The known multipath correcting filter which is designed for a less complex computational filtering process is described below. This conventional multipath correcting filter normalizes the transfer function of a multiple transmission path with reference to a radio wave transmitted directly from the transmitter, i.e., a direct radio wave, for filter calculations. FIG. shows an FM tuner which incorporates this known multipath correcting filter. As shown in FIG. a radio signal which is received by a receiving antenna is applied through a front end or reception circuit 2 to an A/D (analog-to-digital) converter 3, by which the radio signal is converted into a digital signal. The digital signal is then normalized with reference to a direct radio wave by a normalizer 4. The normalized signal $Nx_{(n)}$ is applied to an equalizer 5, which effects multipath correction on the input signal $Nx_{(n)}$ and sends a corrected output signal $y_{(n)}$ to a demodulator 6.

Figure 2:
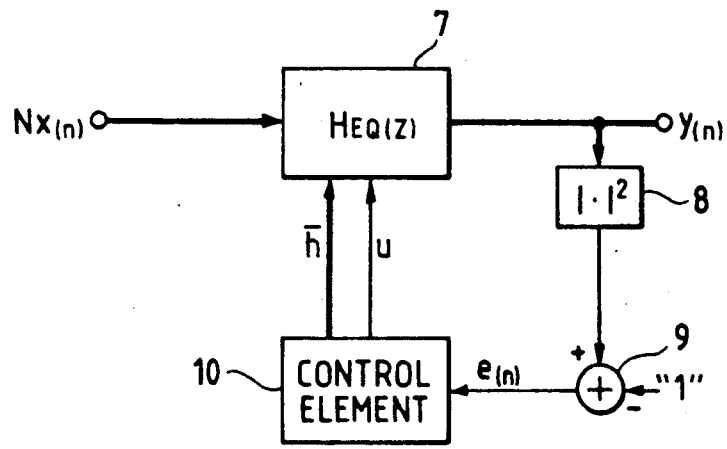
FIG. 2 is a block diagram of another conventional equalizer.
Figure 3:
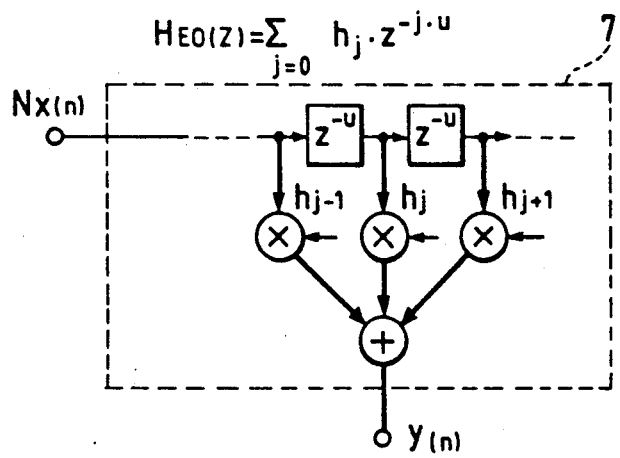
FIG. 3 is a block diagram of a nonrecursive FIR digital filter in the equalizer shown in FIG. 2.

As shown in FIG. 2, the equalizer 5 comprises a digital filter 7 having a transfer function $H_{EQ}(z)$, an absolute value squaring element 8 for extracting he output signal $y_{(n)}$ from the digital filter 7, an adder 9 for comparing the extracted feedback signal and a reference value signal "1" for normalization, and a control element 10 for controlling the filter coefficient of the digital filter 7 and a delay u based on the difference between the compared signals, i.e., an error signal $e_{(n)}$ from the adder 9. The digital filter 7 is an FIR digital filter as shown in FIG. 3.

The transfer function of a multipath transmission path is generally expressed as follows:

$$H_{MP}(j\omega) = \sum_{i=0} r_i \cdot \exp(-j\omega\tau_i) \tag{9}$$

where $r_i$ is the complex amplitude of each radio wave at the reception point and is given by:

$$r_i = p_i \exp(-j\theta_i)$$

$p_i$: the absolute value of the amplitude with reference to a direct radio wave at the reception point;
$\theta_i$: the phase rotation (shift) at the reception point,
$\tau_i$ is the delay time with reference to the direct radio wave, and
$\omega$ is the angular frequency of the signal.

If the transfer function $H_{MP}(j\omega)$ is normalized with reference to the direct radio wave, then the transfer function $H_{MP}(j\omega)$ is rewritten as follows:

$$H_{MP}(j\omega) = 1 + \sum_{i=1} r_i \cdot \exp(-j\omega\tau_i) \tag{10}$$

when the signal is sampled at a cyclic period T and converted into a discrete signal, the transfer function $H_{MP}(j\omega)$ is expressed by:

$$H_{MP}(z) = 1 + \sum_{i=1} r_i \cdot z^{-u_i} \tag{11}$$

$$u_i = \frac{\tau_i}{T} \tag{12}$$

Particularly, if a single radio wave (reflected radio wave) is delayed by a reflection, then the transfer function is given by:

$$H_{MP}(z) = 1 + r \cdot z^{-u} \tag{13}$$

The inverse function $H_{EQ}(z)$ at this time is expressed by:

$$H_{EQ}(z) = \frac{1}{1 + r \cdot z^{-u}} \tag{14}$$

The series expansion of the inverse function $H_{EQ}(z)$ results in:

$$H_{EQ}(z) = \sum_{j=0} (-r)^j \cdot z^{-j \cdot u} \tag{15}$$

which is the inverse function of the multipath transmission path. A multipath correcting filter which has the characteristics of the inverse function $H_{EQ}(z)$ can be realized as a filter which has a nonzero ($\neq 0$) coefficient in only an area which corresponds to a multiple of the delay u that is obtained by normalizing the delay time $\tau$ of the reflected radio wave with the sampling period T. If the reflected wave is not a single wave, then it can be treated in the same manner as with the single reflected wave by defining a time-varying complex amplitude $r_{(n)}$ instead of the complex amplitude r.

As described above, $$F = E(\{|y_{(n)}|^2 - g_{(n)}\}^2) \tag{16}$$

$g_{(n)}$ = constant is employed as the evaluating function F for adaptive control. If a signal which is normalized by a direct radio wave is used, then $$g_{(n)} = 1 \tag{17}$$

can be employed, and hence the evaluating function is given as follows:

$$F = E(\{|y_{(n)}|^2 - 1\}^2) \tag{18}$$

If the nonzero filter coefficient is expressed as $h_j$, then the coefficient vector $\bar{h}$ is given by:

$$\bar{h} = [\ldots, h_j, \ldots]^T \tag{19}$$

(apparently, $h_0 = (-r)^0 = 1$). The renewal equation for obtaining an estimated value $\bar{h}_{(n+1)}$ of the filter coefficient vector at time $(n+1)$ from an estimated value $\bar{h}_{(n)}$ thereof at the time n is given by:

$$\bar{h}_{(n+1)} = \bar{h}_{(n)} - x \cdot \frac{\partial F}{\partial \bar{h}_{(n)}} \tag{20}$$

where x is a positive constant. Alternatively, since each component of the coefficient vector $\bar{h}$ is uniquely determined by the complex amplitude r, the filter coefficient can be determined by the renewal equation, given below, which directly estimates the complex amplitude $r_{(n+1)}$ at the time $(n+1)$.

$$r_{(n+1)} = r_{(n)} - \gamma \cdot \frac{\partial F}{\partial r_{(n)}} \quad (21)$$

where $\gamma$ is a positive constant. The renewal equation for obtaining an estimated value $u_{(n+1)}$ of the filter coefficient vector at the time $(n+1)$ from an estimated value $u_{(n)}$ thereof at the time n is given by:

$$u_{(n+1)} = u_{(n)} - \mu \cdot \frac{\partial F}{\partial u_{(n)}} \quad (22)$$

where $\mu$ is a positive constant. When values of the nonzero filter coefficient and corresponding delays are determined as described above, it becomes possible to reduce the amount of the computational filtering processing and the computational processing for the filter coefficient control.

Figure 4:
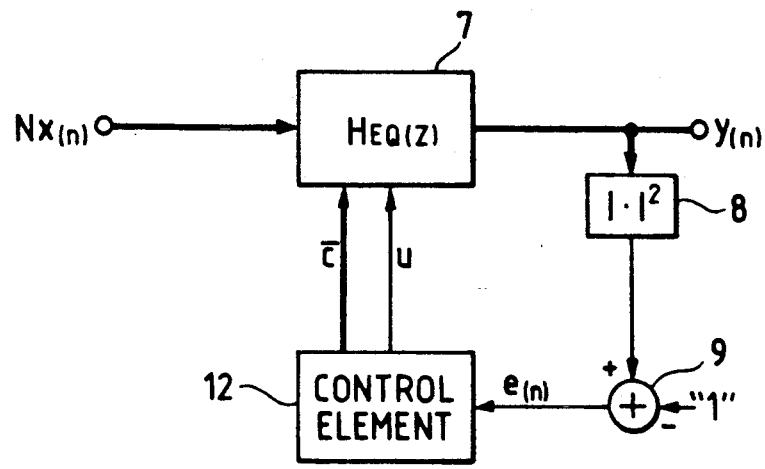
FIG. 4 is a block diagram of a block diagram of still another conventional equalizer.
Figure 5:
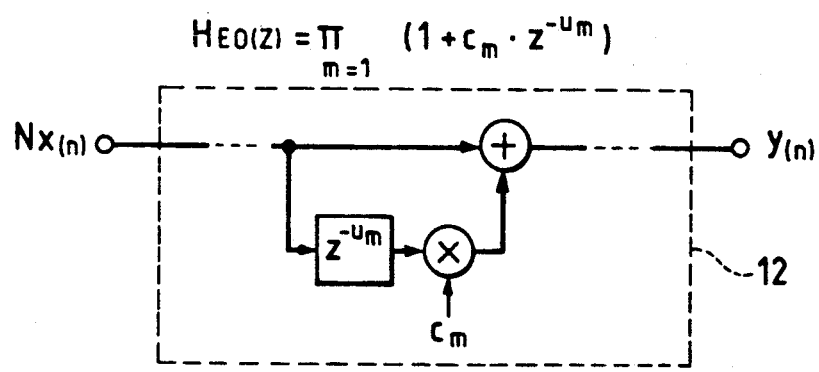
FIG. 5 is a block diagram of a cascaded FIR digital filter in the equalizer shown in FIG. 4.

Another known equalizer which employs a multipath correcting filter in shown is FIGS. 4 and 5 The equalizer shown in FIG. 4 differs from the equalizer shown in FIG. 2 in that the multipath correcting filter comprises a digital filter 11 in the form of a cascade FIR digital filter and that a control element 12 effects renewal control of the filter coefficient c of the digital filter 11. Actually, the multipath correcting filter is constructed as a filter which has a total delay (of a finite length large enough to correct multipath transmission. If the number of nonzero coefficients is selected to be a power of 2, then the transfer function of this filter can be rewritten as:

$$H_{EQ}(z) = \prod_{m=1} (1 + c_m \cdot z^{-um}) \quad (23)$$

where $$c_m = (-r)2^{m-1}, um = 2^{m-1} \cdot u \quad (24)$$

This transfer function can be achieved by cascading filters each having a single coefficient. The adaptive control in the cascaded filter is carried out in the same manner as described above, resulting in a reduction in the amount of the computational filtering process.

In the above conventional arrangements, since a signal which has been subjected to multipath transmission is normalized according to the amplitude of a direct radio wave, the value of $g_{(n)}$ which is the reference value desired filter response) of the envelope in the evaluating function F can theoretically be selected to be:

$$g_{(n)} = 1 \quad (25)$$

In actual radio signals, however, the amplitude $r_i$ of a direct radio wave is unknown and it is impossible to normalize radio signals applied to the multipath correcting filter. Therefore, it is difficult to determine the reference value $g_{(n)}$. With mobile receivers such as car radio receivers, the intensity of a received direct radio wave varies from place to place, and hence the received multipath signals cannot be normalized according to the amplitude $r_i$ of the direct radio wave. In this case, the amplitude of the direct radio wave itself is used as a reference value, rather than any normalized signal. Accordingly, it is highly difficult to obtain an output signal having a constant amplitude.

PRINCIPLES OF THE INVENTION

Using a nonzero filter coefficient vector component $h_j$, the transfer function $H_{EQ}(z)$ of a multipath correcting filter is expressed by:

$$H_{EQ}(z) = \sum_{j=0} h_j \cdot z^{-j \cdot u} \quad (26)$$

The evaluating function F for adaptive control of the filter of the above structure is given as:

$$F = E\left[\{b_{(n)} \cdot |y_{(n)}|^2 - g_{(n)}\}^2\right] \quad (27)$$

$g_{(n)} = $ constant

The reference value $g_{(n)}$ is any optional constant. If the reference value $g_{(n)}$ is selected to be:

$$g_{(n)} = 1 \quad (28)$$

then, the evaluating function is given as follows:

$$F = E\left[\{b_{(n)} \cdot |y_{(n)}|^2 - 1\}^2\right] \quad (29)$$

If the value of the coefficient $b_{(n)}$ in this evaluating function F is subjected to adaptive control, then it is possible to realize a multipath correcting filter without normalization of the input signal according to the amplitude of the direct radio wave.

Adaptive operation of the multipath correcting filter will be described with reference to the determination of a filter coefficient from the complex amplitude r, for example. The renewal equation for estimating the complex amplitude $r_{(n+1)}$ is as follows:

$$r_{(n+1)} = r_{(n)} - \gamma \cdot \frac{\partial F}{\partial r_{(n)}} \quad (30)$$

The renewal equation for obtaining a delay $u_{(n+1)}$ at the time $(n+1)$ is given by:

$$u_{(n+1)} = u_{(n)} - \mu \cdot \frac{\partial F}{\partial u_{(n)}} \quad (31)$$

A coefficient $b_{(n+1)}$ at the time $(n+1)$ is renewed by:

$$b_{(n+1)} = b_{(n)} - \beta \cdot \frac{\partial F}{\partial b_{(n)}} \quad (32)$$

where $\beta$ is a positive constant. The adaptive control of the filter is carried out by repeating the renewal of the above three parameters. The renewal equations for these parameters are expressed more specifically as follows (expected values are replaced with instantaneous values):

$$r_{(n+1)} = r_{(n)} - 4 \cdot \gamma \cdot e_{(n)} \cdot y_{(n)} \cdot \left[\overline{x}_{(n)}^T \cdot \frac{\partial \overline{h}_{(n)}}{\partial r_{(n)}}\right]_* \quad (33)$$

$$U_{(n+1)} = u_{(n)} - 2 \cdot \mu \cdot e_{(n)} \cdot Re \cdot \left[y_{(n)}^* \cdot \overline{h}_{(n)}^T \cdot \frac{\partial \overline{x}_{(n)}}{\partial u_{(n)}}\right] \quad (34)$$

$$b_{(n+1)} = b_{(n)} - 2 \cdot \beta \cdot e_{(n)} \cdot y_{(n)} \cdot y_{(n)}^* \quad (35)$$

where $R_e[\cdot]$ represents the real number part of the complex number, "*" represents the complex conjugate, "$\bar{x}$" represents the vector of the input signal applied to the filter and is expressed by:

$$\bar{x}_{(n)} = [\ldots, x(n-j\cdot u), \ldots]^T \quad (36)$$

$y_{(n)}$ represents the filter output and is expressed as follows:

$$y_{(n)} = \bar{h}_{(n)}^T \cdot \bar{x}_{(n)} \quad (37)$$

and $e_{(n)}$ represents an error signal with respect to the filter output and is given by:

$$e_{(n)} = b_{(n)} \cdot |y_{(n)}|^2 - 1 \quad (38)$$

FIRST EMBODIMENT

Figure 6:
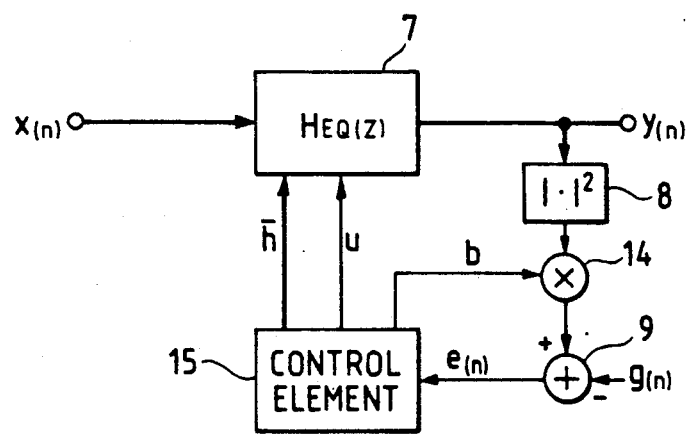
FIG. 6 is a block diagram of a digital equalizer according to a first embodiment of the present invention.

A digital equalizer according to a first embodiment of the present invention is shown in FIG. 6. Those parts of the digital equalizer shown in FIG. 6 which are identical to those of the conventional equalizers are denoted by identical reference numerals, and will not be described in detail.

The digital equalizer shown in FIG. 6 differs from the equalizer shown FIG. 2 in that a multipier 14 for multiplying the output signal from the absolute value squaring element 8 by a coefficient signal b is connected between the absolute value squaring element 8 and the adder 9, that a reference value $g_{(n)}$ is given as a parameter value which is to be converged as desired, but not as a reference value for normalization, and that a control element 15 serves to renew the coefficient signal b according to a filter coefficient $\bar{h}$.

More specifically, the digital equalizer of the invention corrects multipath transmission by effecting adaptive control on the value of the coefficient b(n) in the evaluating function F indicated by the equation (27) or (29), without normalizing the input signal $x_{(n)}$ according to the amplitude r of the direct radio wave, and by carrying out the calculations represented by he equations (30) through (32) (more specifically the equations (33) through (35)). FIGS. 7A-7E show the convergent characteristics of the parameters of the digital equalizer according to the first embodiment at the time when a single reflection is simulated under the following conditions:

Amplitude $|r| = 0.5$
Phase $\theta = 0$
Delay $u = 18.24$
Reference value $g_{(n)} = 2$ Study of FIGS. 7A-7E indicates that the parameters and the output signal $y_{(n)}$ are converged to constant values after elapse of a certain time, showing that multipath correction is properly performed.

The same result is achieved when the coefficient vector $\bar{h}$, rather than the complex amplitude r, is directly renewed.

Figure 8:
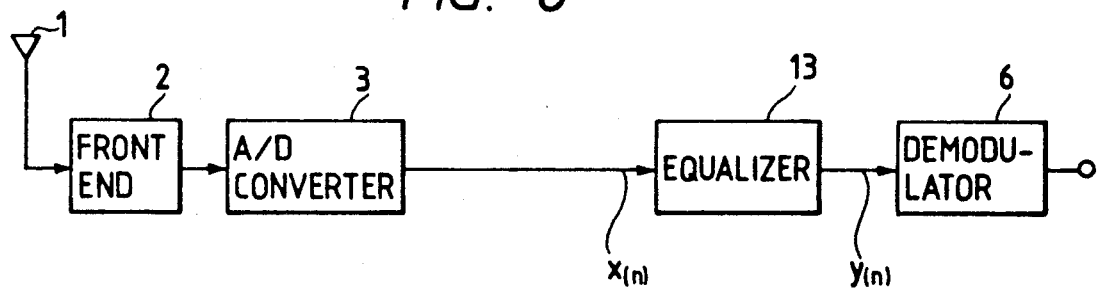
FIG. 8 is a block diagram of an FM tuner which employs the digital filter of the invention.
Figure 7A:
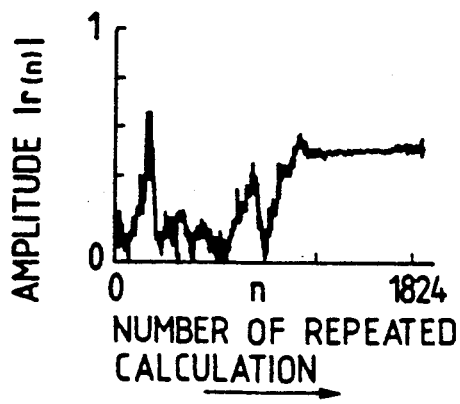
FIGS. 7A-7E are is a set of graphs showing the simulated convergent characteristics of parameters at the time of a single reflection.
Figure 7B:
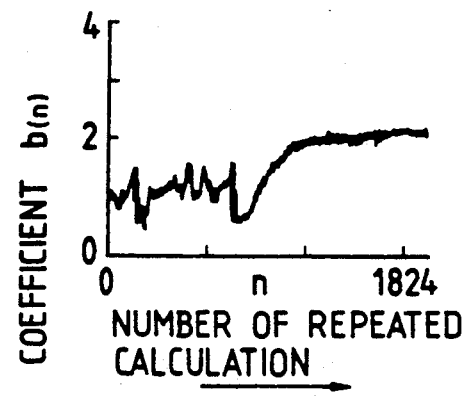
Figure 7C:
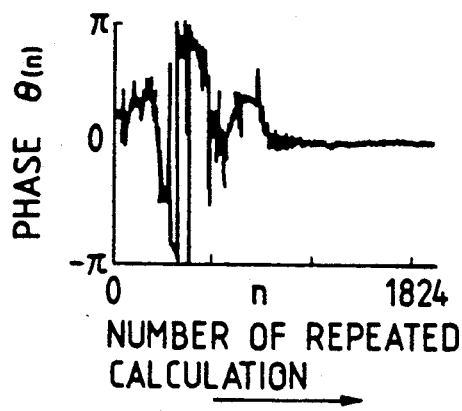
Figure 7D:
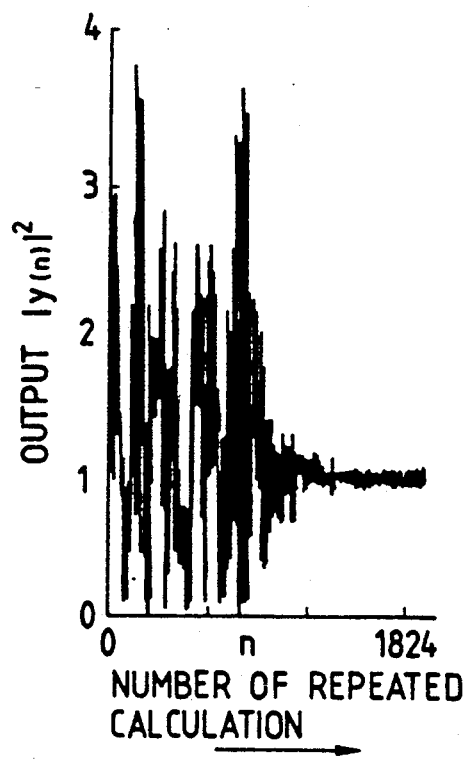
Figure 7E:
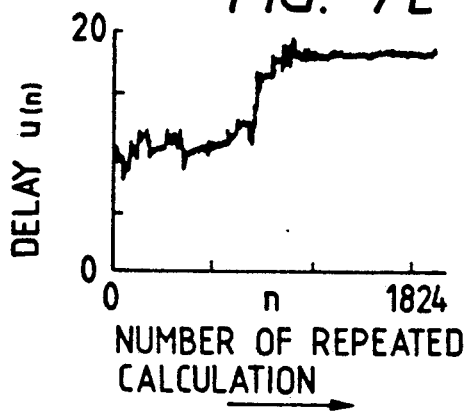

FIG. 8 shows an FM tuner which incorporates the digital equalizer shown in FIG. 6. Comparison between the FM tuners shown in FIGS. 1 and 8 indicates that the normalizer 4 (FIG. 1) is dispensed with in the FM tuner shown in FIG. 8, and the FM tuner shown in FIG. 8 is simpler in construction. The digital filter of the invention is capable of correcting multipath transmission reliably.

SECOND EMBODIMENT

Figure 9:
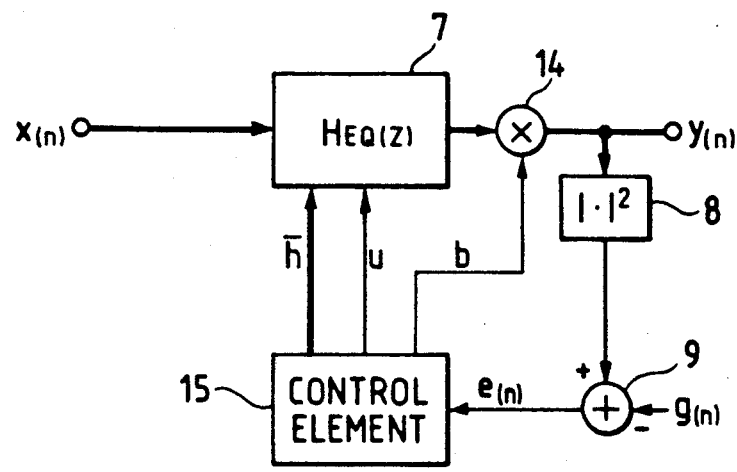
FIG. 9 is a block diagram of a digital equalizer according to a second embodiment of the present invention.

FIG. 9 shows s digital equalizer according to the second embodiment of the present invention is shown in FIG. 6.

The digital equalizer shown in FIG. 9 differs from the equalizer shown in FIG. 6 in that the multiplier 14 is positioned between the digital filter 7 and the absolute value squaring element 8.

More specifically, according to the second embodiment, the coefficient signal b is applied to the multiplier 14 which is connected in cascade to the digital filter having the normalized transfer function $H_{EQ}(z)$ The transfer function $H_{EQ}'(z)$ of the digital filter, which is expressed as:

$$H_{EQ}'(z) = b(n) \cdot H_{EQ}(z)$$

is subjected to adaptive control using the following evaluating function:

$$F = E[\{|y_{(n)}|^2 - g_{(n)}\}^2]$$

$g_{(n)} = $ constant

The parameters of the evaluating function $F_{EQ}'(z)$, i.e., the complex amplitude r, the delay u, and the coefficient b, are renewed according to the following renewed equations:

$$r_{(n+1)} = r_{(n)} - \gamma \cdot \frac{\partial F}{\partial r_{(n)}}$$

$$u_{(n+1)} = u_{(n)} - \mu \cdot \frac{\partial F}{\partial u_{(n)}}$$

$$b_{(n+1)} = b_{(n)} - \beta \cdot \frac{\partial F}{\partial b_{(n)}}$$

Since the output $y_{(n)}$ is multiplied by the coefficient signal b, the same result as the first embodiment can be obtained.

THIRD EMBODIMENT

Figure 10:
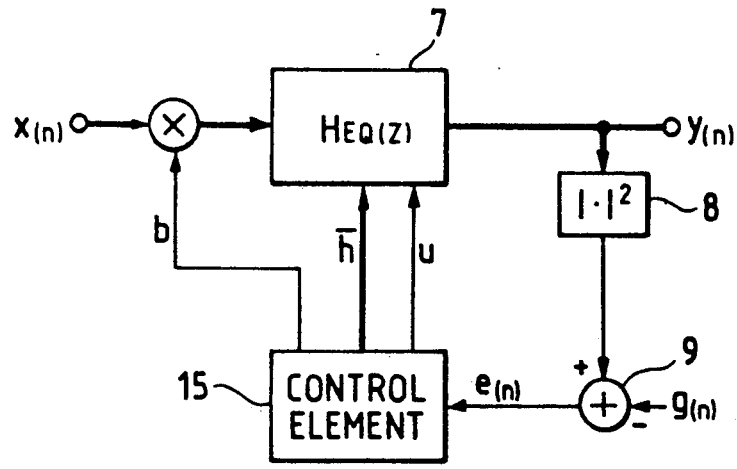
FIG. 10 is a block diagram of a digital equalizer according to a third embodiment of the present invention.

FIG. 10 shows a digital equalizer according to a third embodiment of the present invention.

According to the third embodiment, the multiplier 14 is connected to the input terminal of the digital filter 7, and the multiplier 7 and the digital filter 14 are connected in cascade. The digital equalizer of the third embodiment operates in the same manner as the digital equalizer of the second embodiment. The order in which the multiplier supplied with the coefficient signal b and the digital filter are connected to each other does not affect the value of the output signal $y_{(n)}$. Therefore, the same result as the second embodiment can be obtained.

In each of the first and second embodiments, the digital equalizer employs the nonrecursive FIR digital filter shown in FIGS. 2 and 3. However, the same result can be obtained when the multipath correcting filter comprises a cascaded filter shown in FIGS. 4 and 5 which has the transfer function:

$$H_{EQ}(z) = \pi_{m=1} (1 + c_m \cdot z^{-um})$$

As described above, a multipath correcting filter which can operate on any desired input signal can be realized with a relatively small amount of computational digital filter processing.

While the present invention has been described with reference to a digital equalizer for use in an FM tuner in each of the above embodiments, the principles of the present invention are also applicable to a transmitted signal such a an FM signal in a communication circuit such as a telephone circuit. The FM signals have been described above in the foregoing embodiments. However, other signals having a constant envelope, such as a PM (phase-modulated) signal, an FSK (frequency-shift keying) signal, a PSK (phase-shift keying) signal, may also be processed by the digital equalizer of the present invention. The present invention is also effective in digital modulation such as QPSK (quarternary phase-shift keying), and may be employed to estimate and measure the characteristics of a transmission path.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore to be embraced therein.

What is claimed is:

1. A digital equalizer comprising:
   a digital filter for performing a computational digital filtering process on a digital input signal which corresponds to a multipath signal composed of a plurality of signal components, wherein said signal components having the same frequency differ in amplitude or phase; and
   a feedback circuit comprising:
      comparing means for comparing a feedback signal from said digital filter with a predetermined reference value signal and outputting an error signal representative of said comparison,
      control means, connected to said comparing means, for outputting a filter coefficient vector signal and a delay signal to control the amplitude of said digital filter output signal and for outputting a multiplier coefficient based on said error signal, and
      a multiplier for multiplying said feedback signal by said multiplier coefficient to vary a level of the feedback signal prior to said comparison in order to achieve multipath correction without normalization.

2. A digital filter according to claim 1, wherein said multipath signal comprises a frequency-modulated signal which is sent by way of a multipath transmission.

3. A digital equalizer according to claim 1, wherein said error signal corresponds to a difference between said reference value signal and a product of said feedback signal and said coefficient value signals.

4. A digital equalizer according to claim 1, wherein said feedback circuit further comprises an absolute value squaring element for producing a squared absolute value, said absolute value squaring element being disposed between said digital filter and said multiplier.

5. A digital equalizer according to claim 1, wherein said feedback circuit further comprises an absolute value squaring element for producing a squared absolute value, said absolute value squaring element being disposed between said multiplier and said comparing means.

6. An FM receiver comprising:
   a reception circuit for detecting a signal having a desired frequency from signals received by an antenna and producing a detected output signal;
   an A/D converter for converting the detected output signal into a digital signal;
   a digital equalizer for correcting a multipath signal contained in the digital signal and producing a desired received signal; and
   a demodulator for demodulating said received signal;
   said digital equalizer comprising,
      a digital filter for performing a computational digital filtering process on said multipath signal composed of a plurality of signals, wherein said plurality of signals having the same frequency differ in amplitude or phase, and
      a feedback circuit for comparing a feedback signal with a predetermined reference value signal, and generating an error signal therefrom, said feedback circuit generating a multiplier coefficient, a filter coefficient vector signal and a delay signal to maintain the amplitude of said received signal at a constant level based on said error signal,
   said feedback circuit including a multiplier for multiplying said multipath signal by the multiplier coefficient.

7. An FM receiver according to claim 6, wherein said feedback circuit further comprises an absolute value squaring element for extracting a feedback signal from the output signal of said digital filter.

8. An FM receiver according to claim 6, wherein said multiplier is connected to an input terminal of said digital filter.

9. A digital equalizer according to claim 6, wherein said error signal corresponds to a difference between said reference value signal and a product of said feedback signal and said coefficient value signals.

10. A digital equalizer comprising:
    a digital filter for effecting a computational digital filtering process on a digital input signal which corresponds to a multipath signal composed of a plurality of signal components that are different in amplitude or phase and have the same frequency; and
    a feedback circuit comprising:
       an adder for comparing a feedback signal and a reference value signal and generating an error signal based upon said comparison,
       a control element for generating a filter coefficient and a delay signal used to control the digital filter and a multiplier coefficient based upon said error signal,
       a multiplier for multiplying said multiplier coefficient with said feedback signal, said multiplier connected between said digital filter and said adder, whereby said control element controls said digital filter to maintain a constant amplitude of the output signal and varies said feedback signal without normalizing said feedback signal based upon said error signal.

11. A digital equalizer according to claim 10, wherein said feedback circuit further comprises an absolute value squaring element for extracting said output signal from said digital filter, disposed between said digital filter and said adder.

12. A digital equalizer according to claim 10, wherein said error signal corresponds to a difference between said reference value signal and a product of said feedback signal and said multiplier coefficient.

13. A digital equalizer comprising:
 a digital filter for performing a computational digital filtering process on a digital input signal which corresponds to a multipath signal composed of a plurality of signal components, wherein said signal components having the same frequency differ in amplitude or phase; and
 a feedback circuit comprising:
  means for comparing a feedback signal from said digital filter with a predetermined reference value signal and outputting an error signal representative of said comparison,
  control means, connected so said comparing means, for outputting a filter coefficient vector signal and a delay signal to control the amplitude of said digital filter output signal and for outputting a multiplier coefficient based on said error signal, and
  a multiplier for multiplying said digital input signal by said multiplier coefficient to vary a level of the feedback signal prior to said comparison in order to achieve multipath correction without normalization.

* * * * *